United States Patent [19]
Kim

[11] Patent Number: 6,031,769
[45] Date of Patent: Feb. 29, 2000

[54] DATA READING CIRCUIT FOR SEMICONDUCTOR MEMORY DEVICE

[75] Inventor: Kyung Saeng Kim, Choongcheongbuk-Do, Rep. of Korea

[73] Assignee: LG Semicon Co., Ltd., Cheongju, Rep. of Korea

[21] Appl. No.: 09/174,579

[22] Filed: Oct. 19, 1998

[30] Foreign Application Priority Data

Oct. 24, 1997 [KR] Rep. of Korea ............... 97-54792

[51] Int. Cl.[7] ............................................. G11C 11/04
[52] U.S. Cl. ..................... 365/194; 365/233.5; 365/206
[58] Field of Search ................................. 365/194, 196, 365/233.5, 233, 206, 189.01

[56] References Cited

U.S. PATENT DOCUMENTS

| | | | |
|---|---|---|---|
| 5,537,066 | 7/1996 | Kawashima | 327/55 |
| 5,757,718 | 5/1998 | Suzuki | 365/233.5 |
| 5,889,708 | 3/1999 | Hwang | 365/189.07 |

*Primary Examiner*—David Nelms
*Assistant Examiner*—David Lam
*Attorney, Agent, or Firm*—Fleshner & Kim

[57] ABSTRACT

A data reading circuit for a semiconductor memory device is provided that reduces noise effects by stably operating a latch sense amplifier during a high speed operation. The data reading circuit produces a stable output voltage. The data reading circuit includes a sense amplifier controller that generates a first pulse signal having a time width for fully equalizing a sense amplifier. The sense amplifier generates the first pulse signal by delaying an address transition detection signal while a high level read signal is being outputted. The sense amplifier controller also combines the address transition detection signal and the first pulse signal to output a second pulse signal. A first current mode dual latch sense amplifier senses a data signal from a memory cell in accordance with the second pulse signal from the sense amplifier controller and transfers the sensed data in accordance with the first pulse signal. The data reading circuit produces a stable output voltage without generating an increased width address transition detection signal.

18 Claims, 6 Drawing Sheets

FIG. 1
CONVENTIONAL ART
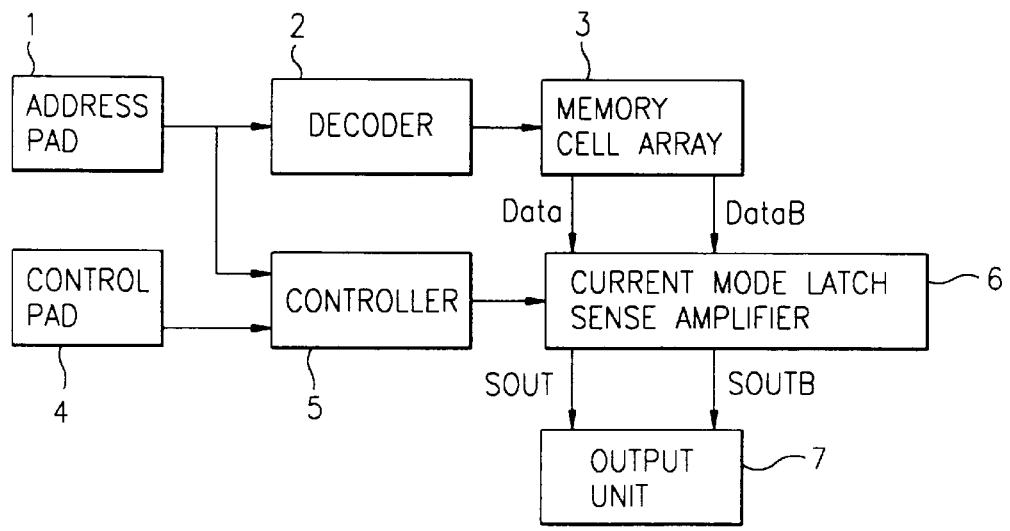
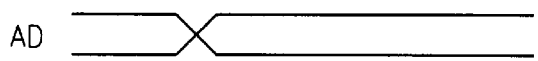
FIG.2A
CONVENTIONAL ART — AD
FIG.2B
CONVENTIONAL ART — ATD
FIG.2C
CONVENTIONAL ART — EQ
FIG.2D
CONVENTIONAL ART — CA
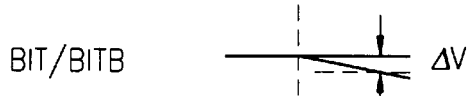
FIG.2E
CONVENTIONAL ART — BIT/BITB
FIG.2F
CONVENTIONAL ART — SAE
FIG.2G
CONVENTIONAL ART — SAEQ FIG.3A BACKGROUND ART  ATD 
FIG.3B BACKGROUND ART  EQ 
FIG.3C BACKGROUND ART  CA 
FIG.3D BACKGROUND ART  BIT/BITB 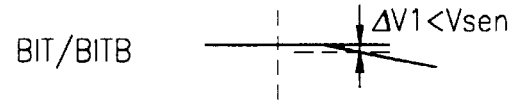
FIG.3E BACKGROUND ART  SAE 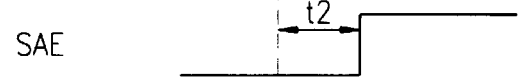
FIG. 4
BACKGROUND ART
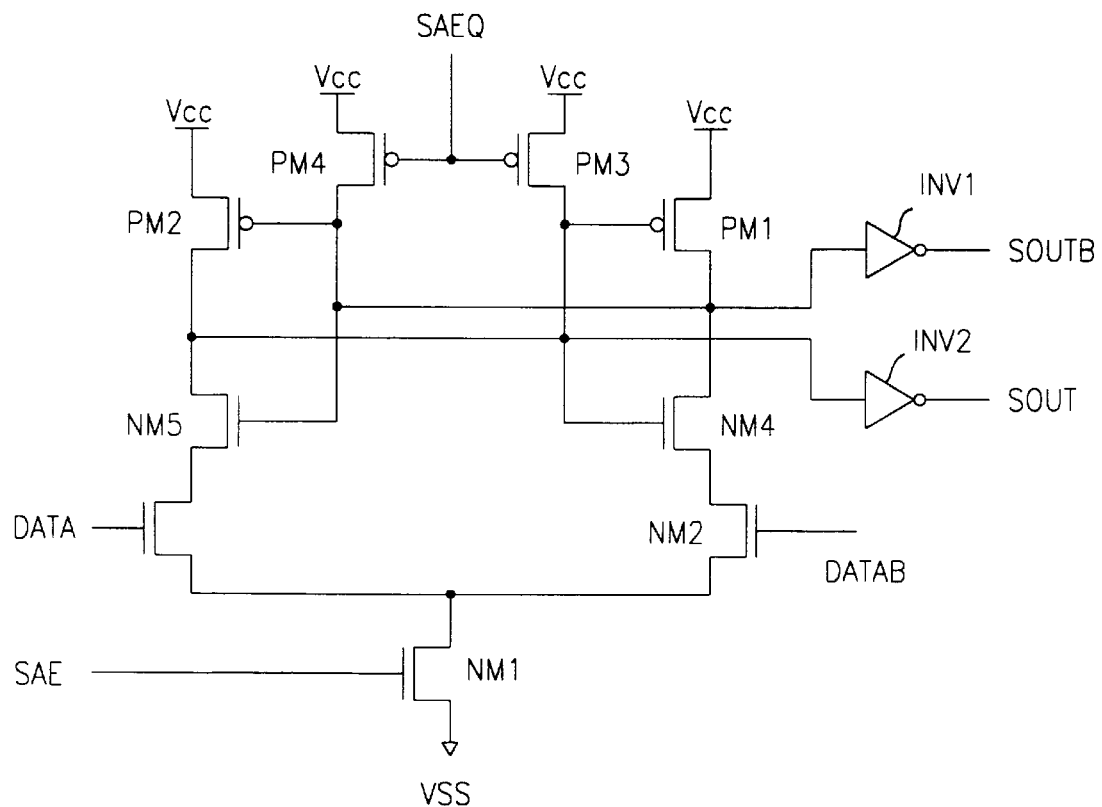

FIG. 7
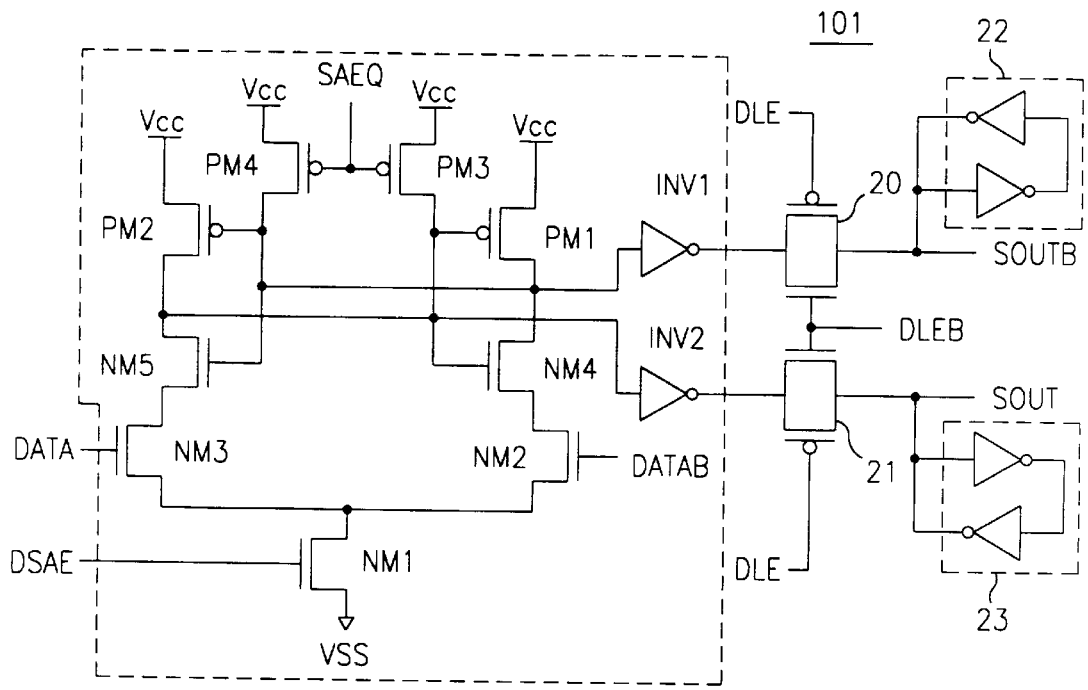
FIG. 8A ATD' 
FIG. 8B RW 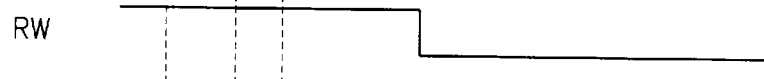
FIG. 8C N1 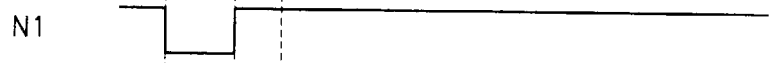
FIG. 8D N2 
FIG. 8E N3 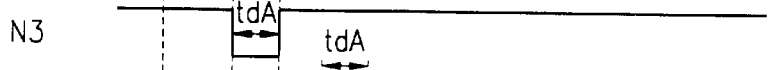
FIG. 8F DLEB 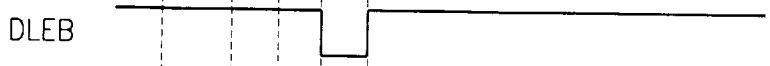
FIG. 8G DLE 
FIG. 8H N4 
FIG. 8I DSAEQ 

FIG.9A AD 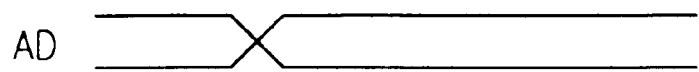
FIG.9B ATD 
FIG.9C CA 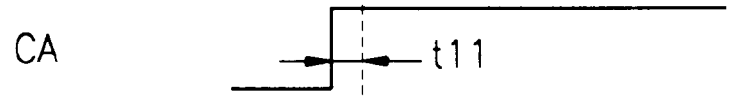
FIG.9D EQ 
FIG.9E BIT/BITB 
FIG.9F DLEB 
FIG.9G DLE 
FIG.9H DSAE 
FIG.9I DSAEQ 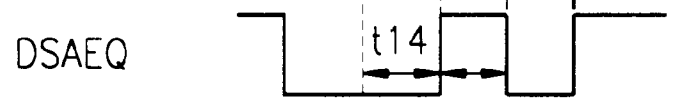
FIG.9J RW 

DATA READING CIRCUIT FOR SEMICONDUCTOR MEMORY DEVICE

BACKGROUND OF THE INVENTION

1. Field of the Invention

The present invention relates to a semiconductor device, and in particular, to a data reading circuit for a semiconductor memory device.

2. Background of the Related Art

As shown in FIG. 1, a data reading circuit for a semiconductor memory device in the related art includes an address pad 1, a decoder 2 for decoding an address signal from the address pad 1, a memory cell array 3, a control pad 4 and a controller 5. The controller 5 detects an address transition signal ATD from the input address signals and outputs various control signals in accordance with a control signal from the control pad 4. A current mode latch sense amplifier 6 amplifys data from the memory cell array 3, and an output unit 7 externally outputs the amplified data. As shown in FIG. 4, the related art current mode latch sense amplifier 6 is configured with a differential amplifier structure in which a sense amplifier equalizing signal SAEQ is connected as a rated voltage source.

The data reading operation of the related art semiconductor memory device will now be described. When an address signal AD inputted through the address pad 1 is transited, the decoder 2 decodes the address signal AD and outputs a cell access signal CA as shown in FIG. 2D so that a corresponding word line WL is activated.

In addition, the controller 5 detects the address transition detection signal ATD from the address signal AD. The controller 5 generates various control signals based on the address transition signal ATD in accordance with the control signal from the control pad 4.

In particular, an equalizing signal EQ, a sense amplifier enable signal SAE, and a sense amplifier equalizing signal SAEQ are respectively generated for precharging the bit line BL and a common data line DL. The bit line BL and the common data line DL are equalized by a voltage (i.e., ½ Vcc) by the equalizing signal EQ as shown in FIG. 2C. Generally, data for cells are carried on the bit line for a predetermined time t1 as shown in FIG. 2D. Thereafter, the data decays.

As a result, an electric potential (i.e., data) of a cell connected with the word line WL is carried on a corresponding bit line /BL, and the voltage of the bit line /BL drops as much as ΔV according to the cell data as shown in FIG. 2E. The case where data "0" is stored in the cell is illustrated in FIG. 2E. At this time, the voltage of the bit line BL maintains a precharged voltage Vcc/2.

In addition, the current mode latch sense amplifier 6 remains equalized until the sense amplifier enable signal SAE is activated by the sense amplifier equalizing signal SAEQ as shown in FIG. 2G. Thereafter, when a predetermined electric potential charge is formed between the bit line BL and the bit line /BL, the current mode latch sense amplifier 6 detects the output data DATA and DATAB from the memory cell array 3. The current mode latch sense amplifier 6 externally outputs the detected data through the output unit 7 in accordance with the sense amplifier enable signal SAE as shown in FIG. 2F.

The latch type sense amplifier has an advantage of low power consumption since the direct current flowing in the sense amplifier is removed after the data of the cell is read. However, when the cell access signal CA and the sense amplifier enable signal SAE as shown in FIG. 3 are mismatched by an inputted noise, the latch type sense amplifier outputs an invalid data depending on its characteristic. Such timing mismatches occur more frequently in high speed devices.

When PMOS transistors PM3 and PM4 and NMOS transistors NM4 and NM5 are turned on as shown in FIG. 4, the current mode latch sense amplifier 6 maintains an equalized state. At this time, since the data DATA and DATAB from the memory cell array 3 are carried on the bit line in accordance with the cell access signal CA shown in FIG. 3C, an electric potential difference ΔV1 is formed between the bit line BL and the bit line /BL as shown in FIG. 3D.

The current mode latch sense amplifier 6 can output an invalid data when the activated sense amplifier enable signal SAE is input when electric potential difference ΔV1 is smaller than a minimum predetermined electric potential difference Vsen for reading normal data. To overcome the invalid data problem, the width of the address transition signal ATD must be increased, which decreases an operational speed of the data reading circuit.

The above references are incorporated by reference herein where appropriate for appropriate teachings of additional or alternative details, features and/or technical background.

SUMMARY OF THE INVENTION

An object of the present invention to provide a data reading circuit for a semiconductor memory device that substantially obviates one or more of the problems encountered in the background art.

Another object of the present invention is to provide a data reading circuit for a semiconductor device that reduces noise.

Another object of the present invention is to provide a data reading circuit that operates a latch sense amplifier during a high speed operation with increased reliability.

Another object of the present invention is to provide a data reading circuit for a semiconductor device that implements a stable output voltage.

To achieve at least the above objects in a whole or in parts, there is provided a data reading circuit for a semiconductor memory device according to the present invention that includes a sense amplifier controller for generating a first pulse signal having a time width to fully equalize a sense amplifier by delaying an address transition detection signal, which is an inner clock signal, while a high level read signal is being outputted, and ORing the address transition detection signal and the first pulse signal to output a second pulse signal, and a first current mode dual latch sense amplifier for sensing a data signal from a memory cell in accordance with the second pulse signal from the sense amplifier controller and transferring the sensed data in accordance with the first pulse signal.

To further achieve at least the above objects in a whole or in parts, there is provided a data reading circuit for a semiconductor memory device according to the present invention that includes a sense amplifier controller that generates a first pulse signal, wherein the sense amplifier controller generates the first pulse signal by delaying a first detection signal according to a prescribed level control signal, and wherein the sense amplifier controller combines the first detection signal and the first pulse signal to output a second pulse signal and a sense amplifier that senses a data signal from a selected memory cell in accordance with the second pulse signal from the sense amplifier controller and transfers the sensed data according to the first pulse signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 1 is a block diagram illustrating a related art data reading circuit for a semiconductor memory device;

FIGS. 2A through 2G are diagrams illustrating timing waveforms for elements of the circuit of FIG. 1;

FIGS. 3A through 3E are diagrams illustrating timing waveforms for elements of the circuit of FIG. 1 when a cell access time and a sense enabling time are mismatched;

FIG. 4 is a circuit diagram illustrating a related art current mode latch sense amplifier;

FIG. 7 is a circuit diagram illustrating a current mode dual latch sense amplifier of FIG. 5;

FIGS. 8A through 8I are diagrams illustrating timing waveforms for elements of the circuit of FIG. 6;

FIGS. 9A through 9J are diagrams illustrating timing waveforms for elements of the circuit of FIG. 5.

DETAILED DESCRIPTION OF PREFERRED EMBODIMENTS

Figure 5:
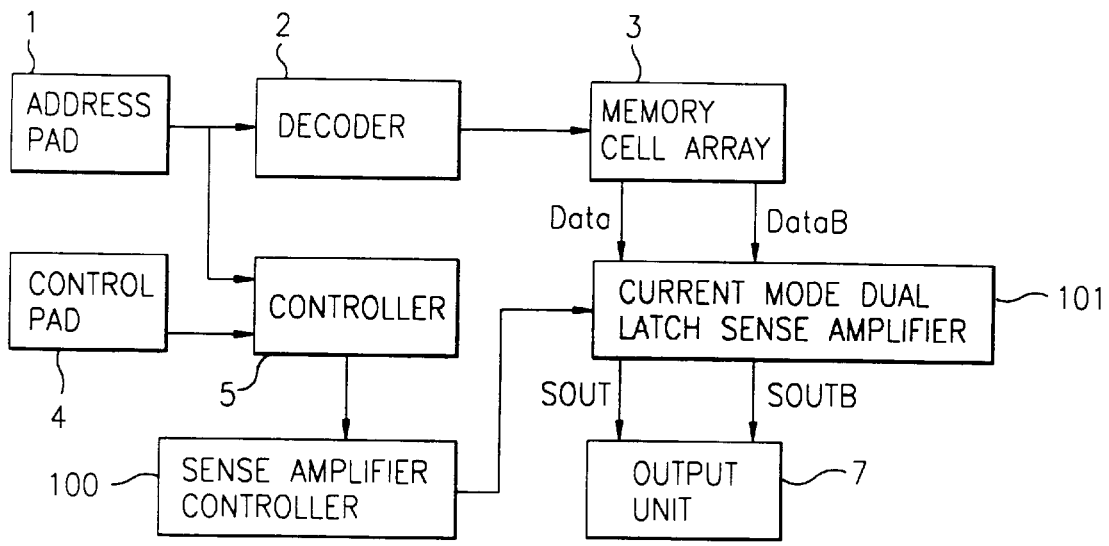
FIG. 5 is a block diagram illustrating a preferred embodiment of a data reading circuit for a semiconductor memory device according to the present invention.

As shown in FIG. 5, a first preferred embodiment of a data reading circuit for a semiconductor memory device according to the present invention includes an address pad 1, a decoder 2 for decoding an address signal from the address pad 1, a memory cell array 3, a control pad 4 and a controller 5. The controller 5 detects an address transition signal ATD from the input address signals and outputs various control signals in accordance with a control signal from the control pad 4. The data reading circuit further includes a current mode dual latch sense amplifier 101 and a sense amplifier controller 100 that receives an address transition detection signal ATD' and a read signal RW and amplifies a data. Further, the sense amplifier controller 100 outputs a control signal for controlling the current mode dual latch sense amplifier 101.

Figure 6:
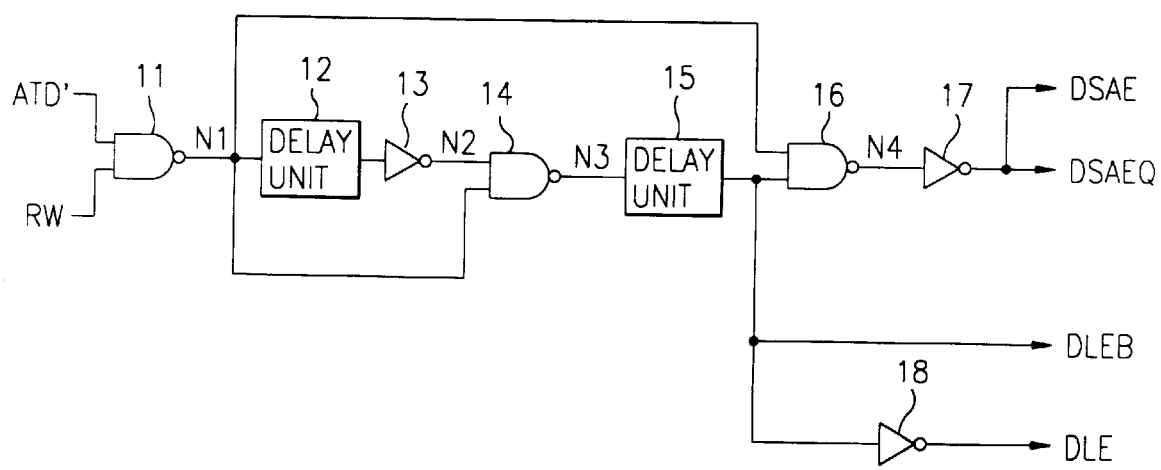
FIG. 6 is a circuit diagram illustrating a sense amplifier controller of FIG. 5.

As shown in FIG. 6, the sense amplifier controller 100 includes a NAND-gate 11 for NANDing an address transition detection signal ATD' and a read signal RW, a delay unit 12 for delaying an output signal from the NAND-gate 11 and an inverter 13 for inverting the output signal from the delay unit 12. A NAND-gate 14 NANDs the output signals from the inverter 13 and the NAND-gate 11, respectively, and a delay unit 15 delays the output signal from the NAND-gate 14. A NAND-gate 16 NANDs the output signals from the delay unit 15 and the NAND-gate 11, and an inverter 17 inverts the output signal from the NAND-gate 16 and outputs a second pulse signal. An inverter 18 inverts the output signal from the delay unit 15 and outputs a first pulse signal.

The first pulse signal is preferably a dual latch enable signal DLE. The second pulse signal is preferably a sense amplifier enable signal DSAE and a sense amplifier equalizing signal DSAEQ.

As shown in FIG. 7, the current mode dual latch sense amplifier 101 includes the current mode latch sense amplifier 6 shown in FIG. 4, transmission gates 20 and 21 and latch units 22 and 23. The transmission gates 20 and 21 transmit an output from the current mode latch sense amplifier 6 in accordance with the dual latch enable signal DLE from the sense amplifier controller 100. The latch units 22 and 23 latch the output signals from the transmission gates 20 and 21.

Figure 10:
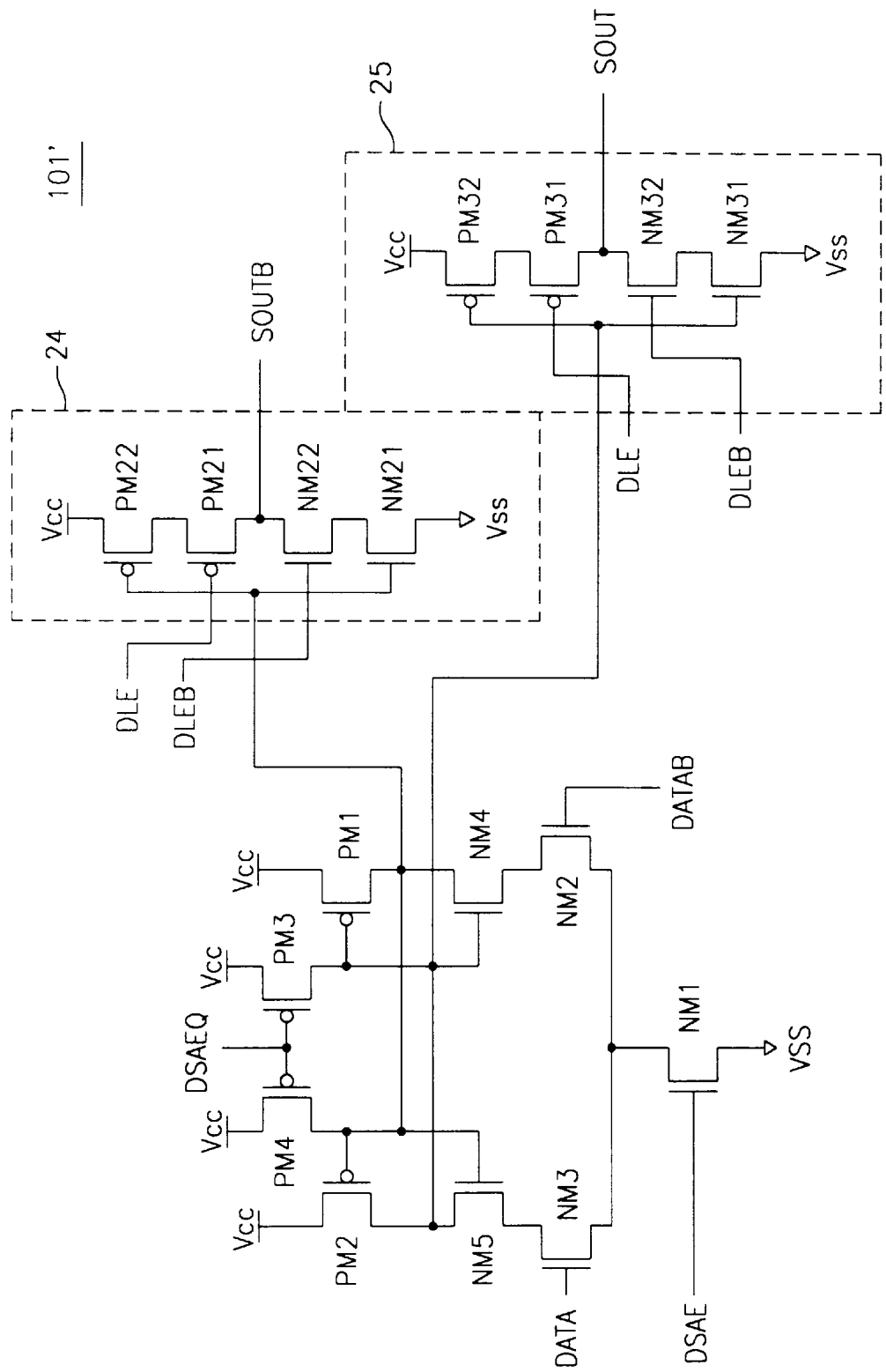
FIG. 10 is a circuit diagram illustrating another preferred embodiment of a current mode latch sense amplifier according to the present invention.

A second preferred embodiment of a current mode dual latch sense amplifier 101' for a data reading circuit will now be described. The second preferred embodiment of a current mode dual latch sense amplifier 101' can be used in the first preferred embodiment of the data reading circuit. As shown in FIG. 10, the address pad 1, decoder 2, memory cell array 3, control pad 4, controller 5, sense amplifier 100 and output unit 7 are similar to the first preferred embodiment, and a detailed description is omitted. As shown in FIG. 10, the second preferred embodiment of the current mode dual latch sense amplifier 101' further includes the first and second inverters 24 and 25, which are controlled by dual latch enable signals DLE and DLEB.

The first inverter 24 includes PMOS transistors PM22 and PM21 and NMOS transistors NM22 and NM21 that are coupled in series between a power voltage Vcc and a ground voltage Vss. The second inverter 25 includes PMOS transistors PM32 and PM31 and NMOS transistors NM32 and NM31 that are also coupled in series between the power voltage Vcc and the ground voltage Vss.

Operations of the preferred embodiments of a data reading circuit for a semiconductor memory device according to the present invention will now be described. As shown in FIG. 9A, when an address signal AD inputted through the address pad 1 is transited, an address transition detection signal ATD shown in FIG. 9B is generated. The bit line BL and the common data line DL are equalized by a voltage ½Vcc for the period of the address transition detection signal ATD.

In addition, the decoder 2 outputs a cell access signal CA, as shown in FIG. 9C, to the memory cell array 3 to activate a corresponding word line WL so that an electric potential (e.g., data) of the cell coupled with the selected word line WL is carried on a corresponding bit line. At this time, there is a prescribed difference of t11 between the releasing times of the cell access signal CA and the address transition detection signal ATD for a more stable operation.

The controller 5 detects the address transition detection signal ATD from the input address signal AD and outputs a width-increased address transition detection signal ATD' as shown in FIG. 8A. At this time, a width of the address transition detection signal ATD' is increased by the duration time t11 after the data of the cell is carried on the bit line.

The sense amplifier controller 100 receives a read signal RW and the address transition detection signal ATD' from the controller 5 and outputs a sense enable signal DSAE, an equalizing signal DSAEQ and dual latch enable signals DLE and DLEB. At this time, the signal from the sense amplifier controller 100 responds to the address transition detection signal ATD' only when the read signal RW is a high level.

The NAND-gate 11 of the sense amplifier controller 100 NANDs the address transition detection signal ATD' shown in FIG. 8A and a high level read signal RW shown in FIG. 8B. The output signal N1 from the NAND-gate 11 shown in FIG. 8C passes through the delay unit 12 and the inverter 13 and becomes a signal N2 shown in FIG. 8D.

At this time, a delay time tdA delayed by the delay unit 12 denotes a time required for equalizing the sense amplifier during which the dual latch enable signals DLE and DLEB are generated.

The NAND-gate 14 NANDs the output signals from the inverter 13 and the NAND-gate 11 and outputs a signal N3 that has a pulse width of tdA as shown in FIG. 8E. The output signal from the NAND-gate 14 is delayed a delay time tdB by the delay unit 15, and first pulse signals being the dual latch enable signals DLE and DLEB are generated each having a pulse width of tdA as shown in FIGS. 8F and 8G.

The NAND-gate 16 NANDs the output signals from the delay unit 15 and the NAND-gate 11, and the inverter 17 inverts the output signal N4 from the NAND-gate 16 to generate a sense amplifier enable signal DSAE and a sense amplifier equalizing signal DSAEQ, which are second pulse signals. As shown in FIG. 8I, at times P1 and P2, the sense amplifier is operated. Thus, in the first preferred embodiment of the data reading circuit, the sense amplifier enable signal DSAE and the sense amplifier equalizing signal DSAEQ are signals obtained by ORing the address transition detection signal ATD' and the dual latch enable signals DLE and DLEB.

At this time, the current mode dual latch sense amplifier 101 maintains an equalizing state until the sense amplifier enable signal DSAE is activated by the sense amplifier equalizing signal DSAEQ as shown in FIG. 9I.

The address transition detection signal ATD as shown in FIG. 9B is decayed after the time T14 is elapsed, and when the electric potential difference between the bit line BL and the bit line /BL has a predetermined value so that the current mode dual latch sense amplifier 101 fully recognizes the cell data, namely, when the same is ΔV1, the sense amplifier equalizing signal DSAEQ as shown in FIG. 9I is decayed, and the cell data is sensed by the sense amplifier enable signal DSAE as shown in FIG. 9H.

Therefore, the current mode dual latch sense amplifier 101 outputs the sensed data to the common data line SOUT and blocks the data output through the common data line SOUT using a high level dual latch enable signal DLE delayed by the address transition detection signal ATD.

Namely, the firstly sensed data is outputted to the common data line SOUT for the time t12, and the current mode dual latch sense amplifier 101 and the common data line SOUT are separated for the time t13 during which the dual latch enable signal DLE is a high level.

In addition, the current mode dual latch sense amplifier 101 is equalized by the sense amplifier equalizing signal DSAEQ, as shown in FIG. 9I, for the time t13. When the signal is fully equalized, the current mode dual latch sense amplifier 101 is operated again, and then the cell data is latched.

Namely, when the common data line SOUT becomes a floating state together with the current mode dual latch sense amplifier 101, the previously transferred data are maintained while the sense amplifier is equalized.

As described above, in the data reading circuit for a semiconductor memory device according to the present invention, it is possible to operate the chip at a high speed mismatched. In addition, in the present invention, when the cell access time and sense amplifier enable time are mismatched, it is possible to prevent a malfunction in the memory device.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A data reading circuit for a semiconductor memory device, comprising:
   a sense amplifier controller that receives a first detection signal and a first control signal and generates a first pulse signal, wherein the sense amplifier controller generates the first pulse signal by delaying the first detection signal according to the first control signal, and wherein the sense amplifier controller combines the first detection signal and the first pulse signal to output a second pulse signal, wherein said sense amplifier controller comprises,
   a logic-circuit, and
   first and second delay units coupled to the logic circuit, wherein the logic circuit receives and logically processes the first detection signal and the first control signal to output the first and second pulse signals; and
   a sense amplifier that senses a data signal from a selected memory cell in accordance with the second pulse signal from the sense amplifier controller and transfers the sensed data according to the first pulse signal.

2. The circuit of claim 1, wherein the second pulse signal prevents a mismatch between a second control signal for selecting the selected memory cell and the data signal being sensed without increasing a prescribed period of the first detection signal.

3. The circuit of claim 1, wherein the first detection signal is an address transition detection signal that is delayed while a read signal is a high level.

4. The circuit of claim 1, wherein the first pulse signal has a prescribed period sufficient to equalize the sense amplifier.

5. The circuit of claim 1, wherein the first detection signal is an inner clock signal.

6. The circuit of claim 1, wherein said logic-circuit comprises:
   a first logic-gate that logically processes the first detection signal and the first control signal that is a read signal, wherein the first delay unit delays an output signal from the first logic-gate;
   a second logic-gate that logically processes an output signal from the first delay unit;
   a third logic-gate that logically processes output signals from the first and second logic-gates, wherein the second delay unit delays an output signal from the third logic-gate;
   a fourth logic-gate that logically processes output signals from the second delay unit and the first logic-gate;
   a fifth logic-gate that logically processes an output signal from the fourth logic-gate and outputs the second pulse signal; and a sixth logic-gate that logically processes the output signal from the second delay unit and outputs the first pulse signal.

7. The circuit of claim 6, wherein the first, third and fourth logic-gates are NAND-gates, and wherein the second, fifth and sixth logic-gates are inverters.

8. The circuit of claim 1, wherein the sense amplifier comprises:

a data sensing unit that senses data from a selected memory cell in accordance with the second pulse signal;

transmission gates that transmit output data from the data sensing unit in accordance with the first pulse signal from the sense amplifier controller; and latch units that latch output signals from the transmission gates.

9. The circuit of claim 1, wherein the sense amplifier is a current mode dual latch sense amplifier.

10. The circuit of claim 1, wherein the sense amplifier comprises:

a data sensing unit that senses the data from the selected memory cell in accordance with the second pulse signal; and first and second inverters that transmit output data from the data sensing unit in accordance with the first pulse signal from the sense amplifier controller.

11. The circuit of claim 10, wherein said first inverter comprises:

first and second PMOS transistors; and first and second NMOS transistors, wherein the first and second PMOS transistors and the first and second NMOS transistors are connected in series between a power voltage and a ground voltage, and wherein said second inverter comprises, third and fourth PMOS transistors, and third and fourth NMOS transistors, wherein the third and fourth PMOS transistors and the third and fourth NMOS transistors are connected in series between the power voltage and the ground voltage.

12. The circuit of claim 1, wherein the second control signal is a cell access signal, wherein the cell access signal determines a corresponding word line of the selected memory cell, wherein the first control signal is a read data signal having one of a high level and a low level value, and wherein the first detection signal is an address transition detection signal.

13. A data reading circuit for a semiconductor memory device, comprising:

a controller responsive to at least one of an address signal and a control signal to output an address transition detection signal and a read signal;

a sense amplifier controller that generates a first pulse signal by delaying the address transition detection signal and that combines the address transition detection signal and the first pulse signal to output a second pulse signal; and a sense amplifier that senses a data signal from a memory cell in accordance with the second pulse signal from the sense amplifier controller and transfers the sensed data according to the first pulse signal, wherein the second pulse signal prevents a mismatch between a cell access signal and the data signal being sensed without increasing a prescribed period of the address transition detection signal, wherein the first pulse signal has a prescribed period sufficient to equalize the sense amplifier, and wherein the sense amplifier controller delays the address transition detection signal while the read signal is high level.

14. The circuit of claim 13, wherein said sense amplifier controller comprises:

a first logic-gate that logically processes the address transition detection signal and the read signal;

a first delay unit that delays an output signal from the first logic-gate;

a second logic-gate that logically processes an output signal from the first delay unit;

a third logic-gate that logically processes output signals from the first and second logic-gates;

a second delay unit that delays an output signal from the third logic-gate;

a fourth logic-gate that logically processes output signals from the second delay unit and the first logic-gate;

a fifth logic-gate that logically processes an output signal from the fourth logic-gate and outputs the second pulse signal; and a sixth logic-gate that logically processes the output signal from the second delay unit and outputs the first pulse signal.

15. The circuit of claim 13 wherein the sense amplifier comprises:

a data sensing unit that senses data from a selected memory cell in accordance with the second pulse signal;

transmission gates that transmit output data from the data sensing unit in accordance with the first pulse signal from the sense amplifier controller; and latch units that latch output signals from corresponding ones of the transmission gates.

16. A circuit, comprising:

a decoder that decodes an address signal to output a cell access signal;

an array of memory cells having a matrix form of rows and columns that receives the cell access signal to select a cell and outputs a data signal from the selected cell;

a sense amplifier controller that receives the address signal and generates a first detection signal, wherein the sense amplifier controller generates a first pulse signal by delaying the first detection signal according to a prescribed level control signal, and wherein the sense amplifier controller combines the first detection signal and the first pulse signal to output a second pulse signal, wherein said sense amplifier controller comprises, a logic-circuit, and first and second delay units coupled to the logic circuit, wherein the logic circuit receives and logically processes the first detection signal and the control signal to output the first and second pulse signals; and a sense amplifier that senses the data signal from the array in accordance with the second pulse signal from the sense amplifier controller and transfers the sensed data according to the first pulse signal.

17. The circuit of claim 16, further comprising an output unit that receives the sensed data and outputs the sensed data, wherein the sense amplifier comprises:

a data sensing unit that senses data from a selected memory cell in accordance with the second pulse signal;

transmission gates that transmit output data from the data sensing unit in accordance with the first pulse signal from the sense amplifier controller; and latch units that latch output signals from the transmission gates.

18. The circuit of claim 16, wherein said logic-circuit comprises:

a first logic-gate that logically processes the first detection signal and the control signal that is a read signal, wherein the first delay unit delays an output signal from the first logic-gate;

a second logic-gate that logically processes an output signal from the first delay unit;

a third logic-gate that logically processes output signals from the first and second logic-gates, wherein the second delay unit delays an output signal from the third logic-gate;

a fourth logic-gate that logically processes output signals from the second delay unit and the first logic-gate;

a fifth logic-gate that logically processes an output signal from the fourth logic-gate and outputs the second pulse signal; and a sixth logic-gate that logically processes the output signal from the second delay unit and outputs the first pulse signal.

\* \* \* \* \*